United States Patent [19]
Dunsmore et al.

[11] Patent Number: 6,018,246
[45] Date of Patent: Jan. 25, 2000

[54] NETWORK ANALYZER MEASUREMENT METHOD FOR HIGH DYNAMIC RANGE DEVICES

[75] Inventors: Joel P. Dunsmore, Sebastopol; Michael S. Marzalek, Rohnert Park; Susan D. Wood, Santa Rosa, all of Calif.

[73] Assignee: Hewlett-Packard Company, Palo Alto, Calif.

[21] Appl. No.: 08/953,356

[22] Filed: Oct. 17, 1997

[51] Int. Cl.[7] ..................................... G01R 13/20
[52] U.S. Cl. .................. 324/638; 324/76.27; 324/76.44; 324/76.29
[58] Field of Search ............................. 324/76.23, 76.27, 324/76.29, 76.44, 650, 638

[56] References Cited

U.S. PATENT DOCUMENTS

| | | | |
|---|---|---|---|
| 4,710,702 | 12/1987 | Itaya | 324/76.29 |
| 4,816,767 | 3/1989 | Cannon et al. | |
| 5,075,618 | 12/1991 | Katayama | 324/76.27 |
| 5,168,213 | 12/1992 | Wardle | 324/76.29 |

*Primary Examiner*—Ernest Karlsen
*Assistant Examiner*—Jose M. Solis
*Attorney, Agent, or Firm*—John L. Imperato

[57] ABSTRACT

A measurement method adjusts the IF bandwidth of a network analyzer to increase measurement speed for high dynamic range devices. According to the first preferred embodiment of the present invention, the bandwidth of the IF filter is adjusted for each corresponding measurement sweep of the network analyzer. The forward transmission and reflection characteristics of the device under test are measured using a first IF bandwidth, and the reverse transmission and reflection characteristics of the device are measured using a second IF bandwidth. When high measurement sensitivity of the forward transmission parameter of the high dynamic range device is sought, the first IF bandwidth is selected to be narrower than the second IF bandwidth. When high measurement sensitivity of the reverse transmission parameter of the high dynamic range device is sought, the first IF bandwidth is selected to be wider than the second IF bandwidth. According to the second preferred embodiment of the present invention, the IF bandwidth is adjusted for each separate measurement sweep corresponding to measurement of each of the forward transmission parameter, the reverse transmission parameter, the forward reflection parameter and the reverse reflection parameter.

12 Claims, 3 Drawing Sheets

NETWORK ANALYZER MEASUREMENT METHOD FOR HIGH DYNAMIC RANGE DEVICES

BACKGROUND OF THE INVENTION

Measurement speed has become an increasingly critical performance feature of modern network analyzers. High measurement speed may be so desirable in a manufacturing environment, that a user of a network analyzer may be willing to sacrifice measurement sensitivity when characterizing some device parameters, such as forward or reverse transmission parameters, if a corresponding increase in measurement speed could be gained. Alternatively, the user may choose to extract less than the full set of characterization parameters measured for a device under test (DUT) if a corresponding increase in measurement speed could be realized. In some measurement applications characterization of some device parameters, such as the reverse transmission scattering parameter S12, may not be necessary to verify performance of the DUT. However, due to measurement errors inherent within commercially available network analyzers, characterization of the forward transmission parameter of a DUT relies on not only measurement of the forward transmission characteristic of the DUT, but also on measurements of the reverse transmission characteristics and the forward and reverse reflection characteristics of the DUT. Thus, even in measurement applications in which only the forward transmission parameter of a device is sought, measurement speed can not be increased by simply omitting the measurements of the reverse transmission parameter and the reflection parameters of the DUT. Measurement speed is especially impacted when the DUT has high attenuation or high dynamic range, producing low-level signals at the network analyzer.

Presently available measurement methods indiscriminantly employ a narrow IF bandwidth in the network analyzer when measuring forward and reverse transmission and reflection characteristics of a high dynamic range DUT in an effort to improve measurement sensitivity. Because the narrow IF bandwidth retards the measurement response time of the network analyzer, measurement speed is unduly limited as a result of this indiscriminant use of the narrow IF bandwidth to measure the full set of transmission and reflection parameters of the DUT.

Accordingly, there is a need for a network analyzer measurement method that increases measurement speed for high dynamic range devices when the full set of device parameters are not sought or when measurement sensitivity can be sacrificed in the characterization of at least one of the device parameters.

SUMMARY OF THE INVENTION

According to the preferred embodiments of the present invention, measurement methods selectively vary the IF bandwidth of a network analyzer to increase measurement speed for high dynamic range devices. Increased measurement speed is realized when less than the full set of forward and reverse transmission and reflection parameters for a device under test (DUT) are sought or when measurement sensitivity of one or more of the device parameters is sacrificed. For DUTs having high dynamic range, noise contributions to the reverse transmission parameter have a negligible effect on measurement accuracy of the forward transmission parameter of the DUT. According to the first preferred embodiment of the present invention, a measurement method includes the steps adjusting the bandwidth of the IF filter for each corresponding measurement sweep of the network analyzer, according to which subset of device parameters are sought. The forward transmission and reflection characteristics of the device under test are measured using a first IF bandwidth, and the reverse transmission and reflection characteristics of the device are measured using a second IF bandwidth. When high measurement sensitivity of the forward transmission parameter, such as the scattering parameter S21 of the high dynamic range device is sought, the first IF bandwidth is selected to be narrower than the second IF bandwidth. When high measurement sensitivity of the reverse transmission parameter, such as the scattering parameter S12 of the device is sought, the second IF bandwidth is selected to be narrower than the first IF bandwidth. When the first IF bandwidth and the second IF bandwidth are greatly disparate, an approximate two-times enhancement in measurement speed is realized from the selection of the two separate IF bandwidths.

According to the second preferred embodiment of the present invention, a separate measurement sweep is employed for each of the forward transmission parameter, the reverse transmission parameter, the forward reflection parameter and the reverse reflection parameter. The measurement method provides for separate selection of the IF bandwidth for each of the four separate measurement sweeps of a network analyzer. Typically, the forward reflection parameter and the reverse reflection parameter have high amplitude and are measured using a relatively wide IF bandwidth. When a narrow IF bandwidth is selected for measurement of only one of the forward or reverse transmission parameters, an approximate four-times enhancement in measurement speed is realized by selecting the narrow IF bandwidth for only one of the four separate DUT measurements.

DETAILED DESCRIPTION OF THE PREFERRED EMBODIMENT

Figure 1:
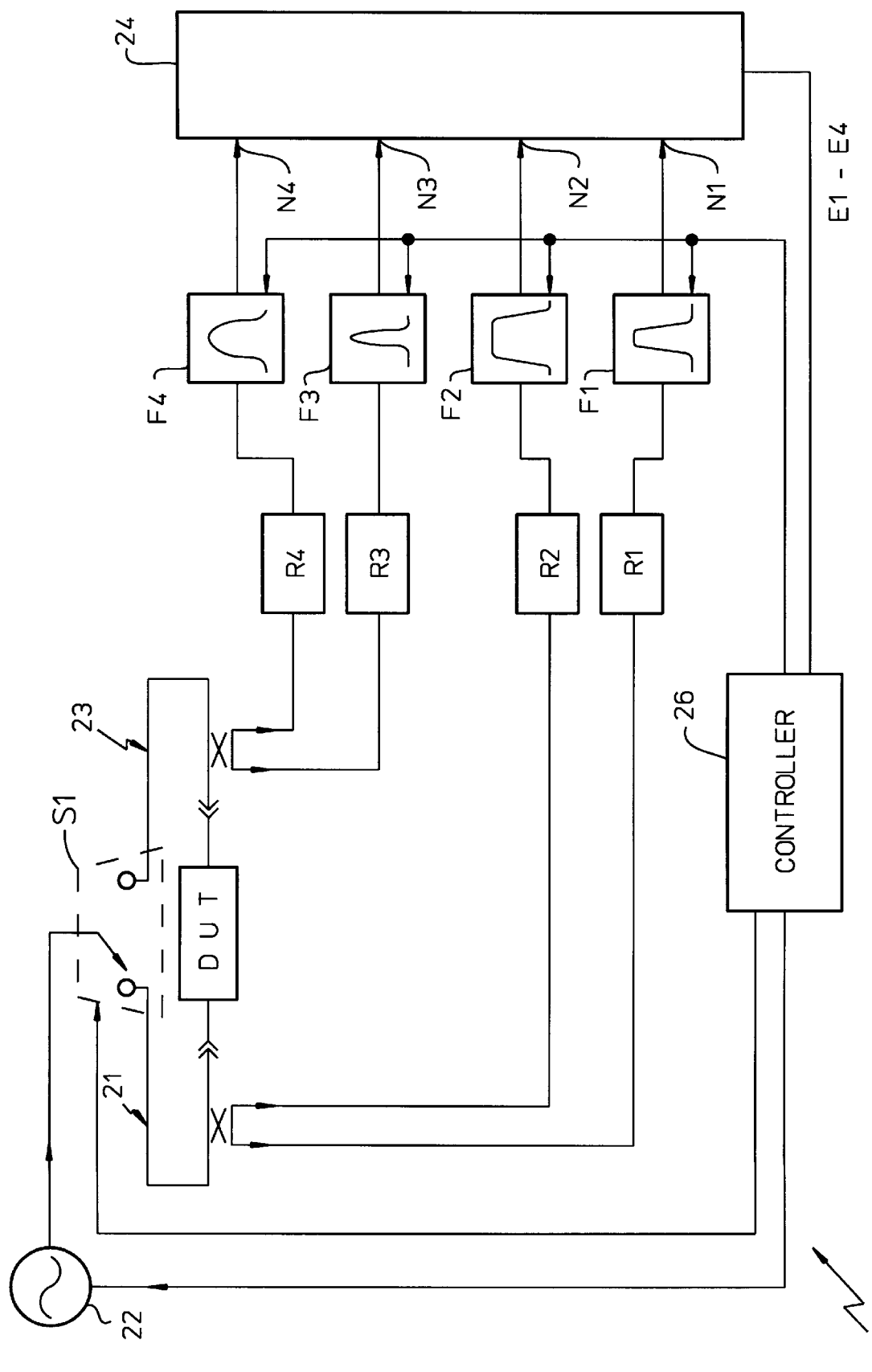
FIG. 1 shows a network analyzer for use with the measurement method constructed according to the preferred embodiments of the present invention.

FIG. 1 shows a network analyzer 20 for use with the measurement methods constructed according to the preferred embodiments of the present invention. A source 22 provides stimulus signals 21, 23 to the device under test (DUT). Receivers R1–R4 measure response signals of the DUT to the stimulus signals 21, 23 provided by the source 22, converting each of the response signals to a fixed intermediate frequency (IF). Intermediate frequency (IF) filters F1–F4 provide filtering for the measured response signals at the fixed IF. The bandwidth of each IF filter F1–F4 is selectable via a bandwidth control signal. The filtered signals at nodes N1–N4 are presented to a detection/processing unit 24. Typically, forward reflection parameters, such as the scattering-parameter (Sparameter) S11, depends primarily upon the ratio of the signal present at node N1 to the signal present at node N2. The reverse reflection parameter, such as the S-parameter S22, depends primarily upon the ratio of the signal present at node N3 to the signal present at node N4. The forward transmission parameter, such as the S-parameter S21, depends primarily upon the ratio of the signals present at nodes N3 and N1. The reverse transmission parameter, such as the S-parameter S12, depends primarily upon the ratio of the signals present at nodes N2 and N4.

Due to mismatch errors E1–E4 within the network analyzer 20, each one of the S-parameters depends on the measured S-parameters S11m, S21m, S12m and S22m. For example, extraction of a desired S-parameter, such as the forward transmission S-parameter S21 is obtained from measured forward transmission characteristic S21m, measured forward refection characteristic S11m, measured reverse reflection characteristic S22m, measured reverse transmission characteristic S12m and from correction by calibration error terms E1–E4 in the detection/processing unit 24, according to the relationship:

$$(1) S21 = S21m(1+S22m*E1)/((1+S11m*E2)(1+S22*E3)-(S21m*S12m*E4))$$

Equation (1) shows that the S-parameter S21 depends on all four measured S-parameters, not just the measured forward transmission S-parameter S21m. Thus, even in measurement environments in which only S-parameter S21 is sought, the measured S-parameters S22m, S11m, S12m are also acquired in order to extract the Sparameter S21 and to accurately represent the forward transmission characteristics of the DUT.

When the DUT has high attenuation or high dynamic range, measuring the forward transmission S-parameter S21m and reverse transmission S-parameter S12m typically involve processing low level signals in the network analyzer 20. When the measured Sparameters S21m and S12m both have low level signals, the product S21m *S12m in equation (1) is small and, as such, the product has negligible effect on the forward transmission S-parameter S21. Added noise due to low sensitivity in the measurement of measured S-parameter S12m has a small effect on the S-parameter S21 at measurement frequencies where the product S21m *S12m is small, since the effect of the added noise is reduced by the product. At measurement frequencies where the signal levels are high, the signal-to-noise ratio (SNR) of the measured S-parameters S21m and S12m is large and high measurement sensitivity is not required in these measurements. Thus, for DUTs having high dynamic range, the bandwidth of the IF filter F2 is adjusted to be relatively wide for measuring the reverse transmission S-parameter S12m. Unlike the measured S-parameter S12m which has secondary effect on the S-parameter S21, the measured S-parameter S21m has a primary effect on the forward transmission S-parameter S21. Thus, a relatively narrow bandwidth is chosen for the IF filter F4 to achieve high measurement sensitivity and high signal-to-noise ratio (SNR) for the measured S-parameter S21m. Typically, the forward and the reverse reflection parameters S11m and S22m involve measuring high amplitude signals and do not require high measurement sensitivity to achieve high measurement accuracy. Therefore, relatively wide IF bandwidths can be chosen for IF filter F1 and IF filter F4. Generally, the device parameters that don't require high measurement sensitivity can be measured using wide bandwidths for the corresponding IF filters to enhance measurement speed of the network analyzer 20.

Figure 2:
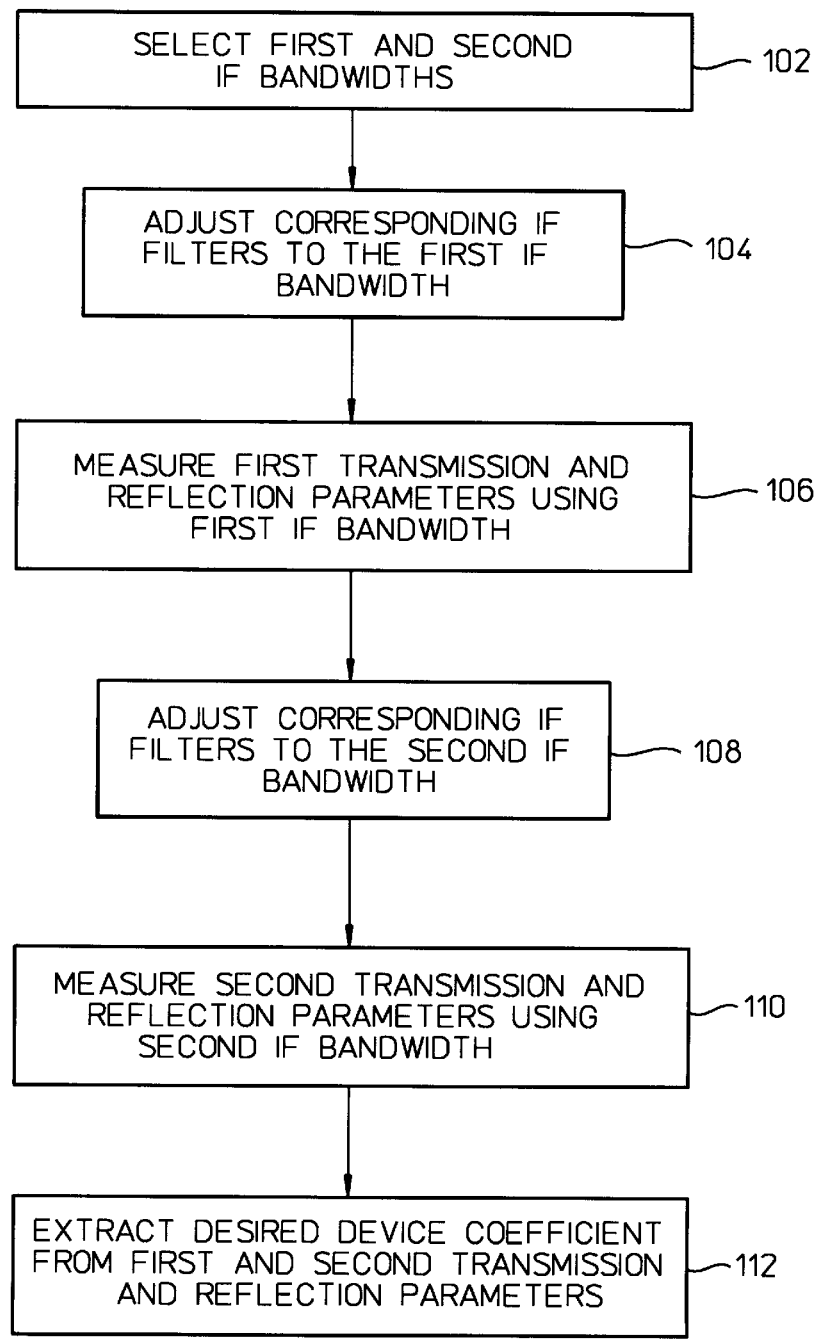
FIG. 2 shows a flow diagram of the network analyzer measurement method constructed according to a first preferred embodiment of the present invention.

FIG. 2 shows a flow diagram of the network analyzer measurement method 100 constructed according to a first preferred embodiment of the present invention. In step 102 of the measurement method 100, a first bandwidth is selected for each of the IF filters F1, F2 and F4 and a second IF bandwidth is selected for each of the IF filters Fl, F3 and F4. The first IF bandwidth of each of the IF filters Fl, F2 and F4 may be selected to be equal or nonequal to each other. Similarly, the second IF bandwidth of each of the IF filters Fl, F3 and F4 may be selected to be equal or nonequal to each other. For the particular network analyzer 20 shown in FIG. 1, IF filters F1, F2 and F4 are the IF filters corresponding to measurements of the forward transmission and reflection parameters of the DUT and IF filters F1, F3 and F4 are the IF filters corresponding to measurements of the reverse transmission and reflection parameters. Depending on the particular hardware configuration of the network analyzer 20 used with the preferred embodiments of the present invention, a decreased or increased number of IF filters may correspond to each measurement parameter.

In step 104 of the measurement method 100, the IF filters F1, F2 and F4 are each adjusted to their first IF bandwidth (s). In step 106 of the measurement method 100, the forward transmission parameter S21m and the forward reflection parameter S11m are measured simultaneously. These measurements are acquired at a single frequency of source 22. Alternatively, the measurements are acquired within a frequency sweep of the source over a predefined frequency range. In step 108 of the measurement method 100, the IF filters F1, F3 and F4 are each adjusted to their second IF bandwidth(s). In step 110 of the measurement method 100, the reverse transmission parameter S12m and the reverse reflection parameter S22m are measured simultaneously. These measurements are acquired at a single frequency of source 22. Alternatively, the measurements are acquired within a frequency sweep of the source over a predefined frequency range. When the forward transmission parameter S21 is sought, the first IF bandwidth is adjusted to be narrow relative to the second IF bandwidth. When the reverse transmission parameter S12 is sought, the first IF bandwidth is adjusted to be wide relative to the second IF bandwidth. Once the measured S-parameters S21m, S22m, S12m and S11m are acquired, the desired S-parameter, such as S21 is extracted from the measured S-parameters and by correcting for error terms E1–E4 of the network analyzer 20 in step 112 of the measurement method 100. Equation (1) provides an example of a means for correcting for error terms E1–E4 and extracting the desired S-parameter S21 from the measured S-parameters S21m, S22m, S12m and S11m. Error terms E1–E4 are derived using known calibration techniques, such as those taught by Cannon in U.S. Pat. No. 4,816,767. Typically, the extracted S-parameter or device coefficient, for example S21, is output to a display or other output device (not shown). When the first IF bandwidth and the second IF bandwidth are greatly disparate, an approximate two-times enhancement in measurement speed is realized as a result of selecting a wide IF bandwidth for half of the number of measurements of the network analyzer 20.

Figure 3:
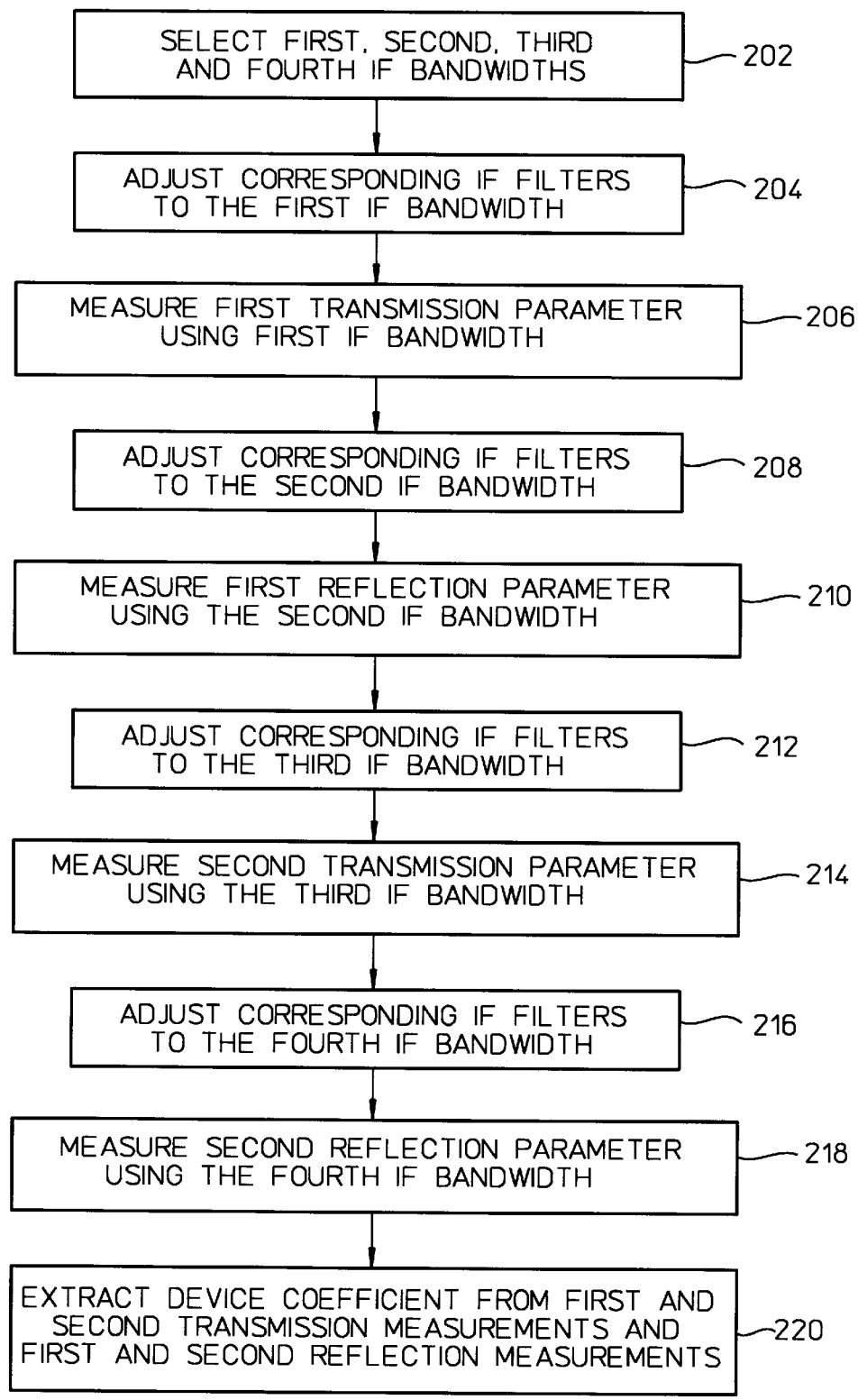
FIG. 3 shows a flow diagram of the network analyzer measurement method constructed according to a second preferred embodiment of the present invention.

FIG. 3 shows a flow diagram of the network analyzer measurement method 200 constructed according to a second preferred embodiment of the present invention. In a variety of network analyzer measurement applications it may be desirable to characterize each of forward transmission parameter, the reverse transmission parameter, the forward reflection parameter and the reverse reflection parameter, using a separate measurement by the network analyzer 20. For example, to reduce signal cross-talk and increase signal isolation between transmission and reflection measurements of a high dynamic range DUT within the network analyzer 20, transmission measurements and reflection measurements may be made using separate measurement sweeps or separate single-frequency stepped measurements of the network analyzer 20. The measurement method of FIG. 3 provides for separate selection of the bandwidth of each of the IF filters F1–F4 corresponding to each of the four separate measurement sweeps or frequency-stepped measurements used to acquire measured characteristics of the DUT.

In step 202 of the measurement method 200, a first IF bandwidth is selected for the IF filters F2 and F4, a second IF bandwidth is selected for the IF filters F1 and F2, a third IF bandwidth is selected for the IF filters F1 and F3 and a fourth IF bandwidth is selected for the IF filters F3 and F4. The IF filters F2 and F4 are the IF filters within the network analyzer 20 corresponding to measurement of the forward transmission parameter S21m of the DUT. The IF filters F1 and F2 are the IF filters within the network analyzer 20 corresponding to measurement of the forward reflection parameter S11m of the DUT. The IF filters F1 and F3 are the IF filters within the network analyzer 20 corresponding to measurement of the reverse transmission parameter S12m of the DUT. The IF filters F3 and F4 are the IF filters within the network analyzer 20 corresponding to measurement of the reverse reflection parameter S22m of the DUT.

In step 204 of the measurement method 200, the IF filters F2 and F4 are adjusted to the first IF bandwidth and in step 206, the forward transmission parameter S21m is measured using the first IF bandwidth. In step 208 of the measurement method 200, the IF filters F1 and F2 are adjusted to the second IF bandwidth and in step 210, the forward reflection parameter S11m is measured using the second IF bandwidth. In step 212 of the measurement method 200, the IF filters F1 and F3 are adjusted to the third IF bandwidth and in step 214, the reverse transmission parameter S12m is measured using the third IF bandwidth. In step 216 of the measurement method 200, the IF filters F3 and F4 are adjusted to the fourth IF bandwidth and in step 218, the reverse reflection parameter S22m is measured using the fourth IF bandwidth. Once the measured S-parameters S21m, S22m, S12m and S11m are acquired, the desired S-parameter, or device coefficient, such as S21 is extracted from the measured Sparameters in step 220 of the measurement method 200. The device coefficient is extracted from the measured S-parameters S21m, S11m, S12m and S22m and by correcting for error terms E1–E4 of the network analyzer 20. Typically, the extracted S-parameter, for example S21, is output to a display or other output device (not shown).

Typically, the forward and the reverse reflection parameters S11m and S22m involve measuring high amplitude signals and may not require high measurement sensitivity. Therefore, relatively wide IF bandwidths can be selected for the IF filters F1–F4 of the network analyzer 20 corresponding to the measurement of those reflection parameters. When the forward transmission parameter S21 is sought, the second IF bandwidth is adjusted to be narrow relative to the second third IF bandwidth. When the reverse transmission parameter S12 is sought, the third IF bandwidth is adjusted to be narrow relative to the second IF bandwidth. When a narrow IF bandwidth is selected for measurement of only one of the forward or reverse transmission parameters, an approximate four-times enhancement in measurement speed is realized as a result of the selection of the narrow IF bandwidth for only one of the four separate measurements.

The network analyzer measurement methods 100, 200 constructed according to the preferred embodiments of the present invention are implemented in a variety of ways. The measurement methods 100, 200 are typically implemented using firmware or software to program a controller 26 (shown in FIG. 1). The controller 26 may be a microprocessor, internal to the network analyzer 20, or alternatively, may be a microprocessor or computer external to the network analyzer 26. When the controller 26 is external, the measurement methods 100, 200 are executed over a local area network (LAN), Hewlett-Packard Interface Bus (HPIB), VXI interface, or other type of interface between the controller 26 and the network analyzer 20.

While the measurement methods 100, 200 are illustrated for DUTs having two ports, the methods readily accommodate devices having an arbitrary number of ports, by providing adjustment of the bandwidth of the IF filters within the network analyzer according to the device parameters being sought.

What is claimed is:

1. A measurement method for a network analyzer having at least one first adjustable IF filter for measuring forward transmission parameters and forward reflection parameters of a device under test and having at least one second adjustable IF filter for measuring reverse transmission parameters and reverse reflection parameters of the device under test, the measurement method comprising the steps of:

selecting a first predefined bandwidth for the at least one first adjustable IF filter;

selecting a second predefined bandwidth for the at least one second adjustable IF filter;

adjusting the bandwidth of the at least one first adjustable IF filter to the first predefined bandwidth;

measuring the forward transmission parameters and forward reflection parameters of the device under test;

adjusting the bandwidth of the at least one second adjustable IF filter to the second predefined bandwidth;

measuring the reverse transmission parameters and reverse reflection parameters of the device under test; and extracting at least one of a forward transmission coefficient, a forward reflection coefficient, a reverse transmission coefficient, and a reverse reflection coefficient of the device under test from the measured forward transmission parameters, the measured forward reflection parameters, the measured reverse transmission parameters and the measured reverse reflection parameters.

2. The method of claim 1 wherein the first predefined bandwidth is less than the second predefined bandwidth when at least one of the forward transmission coefficient and the forward reflection coefficient is extracted.

3. The method of claim 1 wherein the first predefined bandwidth is greater than the second predefined bandwidth when at least one of the reverse transmission coefficient and the reverse reflection coefficient is extracted.

4. The method of claim 1 wherein the step of measuring the forward transmission parameters and forward reflection parameters includes measuring the forward transmission parameters and the forward reflection parameters at a single frequency.

5. The method of claim 1 wherein the step of measuring the forward transmission parameters and forward reflection parameters includes measuring the forward transmission parameters and the forward reflection parameters over a predefined frequency range.

6. The method of claim 1 wherein the step of measuring the reverse transmission parameters and reverse reflection parameters includes measuring the reverse transmission parameters and the reverse reflection parameters at a single frequency.

7. The method of claim 1 wherein the step of measuring the reverse transmission parameters and reverse reflection parameters includes measuring the reverse transmission parameters and the reverse reflection parameters over a predefined frequency range.

8. A measurement method for a network analyzer having at least one first adjustable IF filter for measuring forward transmission parameters, having at least one second adjustable IF filter for measuring forward reflection parameters, having at least one third adjustable IF filter for measuring reverse transmission parameters, and having at least one fourth adjustable IF filter for measuring reverse reflection parameters of a device under test, the measurement method comprising the steps of:

selecting a first predefined bandwidth for the at least one first adjustable IF filter;

selecting a second predefined bandwidth for the at least one second adjustable IF filter;

selecting a third predefined bandwidth for the at least one third adjustable IF filter;

selecting a fourth predefined bandwidth for the at least one fourth adjustable IF filter;

adjusting the bandwidth of the at least one first adjustable IF filter to the first predefined bandwidth;

measuring the forward transmission parameters of the device under test;

adjusting the bandwidth of the at least one second adjustable IF filter to the second predefined bandwidth;

measuring the forward reflection parameters of the device under test;

adjusting the bandwidth of the at least one third adjustable IF filter to the third predefined bandwidth;

measuring the reverse transmission parameters of the device under test;

adjusting the bandwidth of the at least one fourth adjustable IF filter to the fourth predefined bandwidth;

measuring the reverse reflection parameters of the device under test;

extracting at least one of a forward transmission coefficient, a forward reflection coefficient, a reverse transmission coefficient, and a reverse reflection coefficient of the device under test from the measured forward transmission parameters, the measured forward reflection parameters, the measured reverse transmission parameters and the measured reverse reflection parameters.

9. The method of claim 8 wherein the second predefined bandwidth is narrower than at least one of the first predefined bandwidth, the fourth predefined bandwidth, and the third predefined bandwidth when the forward transmission coefficient is extracted.

10. The method of claim 8 wherein the third predefined bandwidth is narrower than at least one of the first predefined bandwidth, the second predefined bandwidth and the fourth predefined bandwidth when the reverse transmission coefficient is extracted.

11. The method of claim 8 wherein the step of measuring the forward transmission parameters includes measuring the forward transmission parameters at a single frequency, the step of measuring the forward reflection parameters includes measuring the forward reflection parameters at a single frequency, the step of measuring the reverse transmission parameters includes measuring the reverse transmission parameters at a single frequency, and the step of measuring the reverse reflection parameters includes measuring the reverse reflection parameters at a single frequency.

12. The method of claim 8 wherein the step of measuring the forward transmission parameters includes measuring the forward transmission parameters over a predefined frequency range, the step of measuring the forward reflection parameters includes measuring the forward reflection parameters over a predefined frequency range, the step of measuring the reverse transmission parameters includes measuring the reverse transmission parameters over a predefined frequency range, and the step of measuring the reverse reflection parameters includes measuring the reverse reflection parameters over a predefined frequency range.

* * * * *